(12) United States Patent
Sander et al.

(10) Patent No.: US 10,856,440 B2
(45) Date of Patent: Dec. 1, 2020

(54) APPARATUS AND METHOD FOR COOLING AN ELECTRONIC ASSEMBLY

(71) Applicant: HENSOLDT Sensors GmbH, Taufkirchen (DE)

(72) Inventors: Joerg Sander, Ulm (DE); Tim Moser, Langenbruck (DE)

(73) Assignee: HENSOLDT Sensors GmbH, Taufkirchen (DE)

(*) Notice: Subject to any disclaimer, the term of this patent is extended or adjusted under 35 U.S.C. 154(b) by 0 days.

(21) Appl. No.: 16/563,343

(22) Filed: Sep. 6, 2019

(65) Prior Publication Data

US 2020/0084916 A1 Mar. 12, 2020

(30) Foreign Application Priority Data

Sep. 7, 2018 (EP) .................................... 18193184

(51) Int. Cl.
*H05K 7/20* (2006.01)
*F01K 25/14* (2006.01)

(52) U.S. Cl.
CPC ......... *H05K 7/20309* (2013.01); *F01K 25/14* (2013.01); *H05K 7/20936* (2013.01)

(58) Field of Classification Search
CPC . H05K 7/20309; H05K 7/20936; F01K 25/14
USPC ........................................................ 361/700
See application file for complete search history.

(56) References Cited

U.S. PATENT DOCUMENTS

| 5,419,780 A * | 5/1995 | Suski ...................... H01L 23/38 |
| | | 136/205 |
| 6,989,989 B2 * | 1/2006 | Brasz ..................... H01L 23/427 |
| | | 257/E23.088 |
| 7,289,325 B2 * | 10/2007 | Brasz ..................... H01L 23/427 |
| | | 257/E23.088 |
| 2003/0093995 A1 | 5/2003 | Tadayon et al. |
| 2009/0120618 A1* | 5/2009 | Konig ........................ G06F 1/20 |
| | | 165/104.21 |
| 2009/0242174 A1 | 10/2009 | McCutchen et al. |
| 2010/0018207 A1* | 1/2010 | Juchymenko ......... F01K 23/065 |
| | | 60/670 |
| 2010/0064682 A1* | 3/2010 | Kamen .................. F01K 23/065 |
| | | 60/526 |
| 2013/0133868 A1* | 5/2013 | Lehar ........................ F28F 9/00 |
| | | 165/168 |
| 2013/0286591 A1 | 10/2013 | Myers et al. |
| 2018/0252120 A1* | 9/2018 | Ohman .................... F01K 11/00 |

OTHER PUBLICATIONS

European Search Report issued in European counterpart application No. 18193184.1-1008 dated Mar. 19, 2019 (Seven (7) pages).

* cited by examiner

*Primary Examiner* — Anatoly Vortman
(74) *Attorney, Agent, or Firm* — Crowell & Moring LLP

(57) ABSTRACT

An apparatus configured to cool an electronic assembly includes an evaporator configured to evaporate a cooling medium using heat of the electronic assembly, and a power transformer configured to transform energy stored in the evaporated cooling medium into electric power. The cooling medium has an evaporating temperature at atmospheric pressure within a temperature range of 50° C. to 80° C.

9 Claims, 2 Drawing Sheets

APPARATUS AND METHOD FOR COOLING AN ELECTRONIC ASSEMBLY

CROSS REFERENCE TO RELATED APPLICATIONS

This application claims priority under 35 U.S.C. § 119 from European Application No. 18193184.1, filed Sep. 7, 2018, the entire disclosure of which is herein expressly incorporated by reference.

BACKGROUND AND SUMMARY OF THE INVENTION

The present invention relates to an apparatus and to a method for cooling an electronic assembly and in particular to a cooling system with an integrated power generation.

Modern electronic systems exhibit an increasing power consumption resulting in a significant heating of these systems. This heating may deteriorate not only the performance, but limits also the reliability and functionality of the corresponding electronic assembly.

The thermal management of electronic assemblies is thus one of the most challenging issues to be addressed. There is an enormous energy amount for air conditioning needed to cool down the electronic assemblies to a temperature, where they operate correctly. This increases the costs of operation considerably.

Therefore, there is a demand of lowering the costs needed for cooling these electronic assemblies while maintaining correct operation and thus increasing the efficiency of the overall system.

At least some of the above-mentioned problems are solved by an apparatus for cooling an electronic assembly and a corresponding method as claimed.

The present invention relates to an apparatus for cooling an electronic assembly. The apparatus comprises: an evaporator for evaporating a cooling medium using heat of the electronic assembly, and a power transformer for transforming energy stored in the evaporated cooling medium (as latent heat) into electric power. The cooling medium comprises an evaporating temperature at atmospheric pressure within a temperature range of 50° C. to 80° C. (or about 65° C.).

It is understood that the evaporator and the power transformer are sufficiently small to employ the apparatus in combination with an electronic assembly (for example, a microprocessor or the fan of at least one processor). Therefore, the evaporator as well as the power transformer may be formed as a microsystem that can be integrated, for example, on a corresponding circuit board or directly on the processors. The phase transition provides likewise an efficient mechanism to absorb a large amount of heat which is stored in the cooling medium as latent heat, because the evaporation temperature defines a temperature limitation that can be exceeded only after evaporation of the complete cooling medium. Hence, the system will not surpass this temperature.

Optionally the apparatus further comprises a feedback line for supplying the electric power to the electronic assembly for reusing the energy generated by cooling the electronic assembly. As a result, the efficiency of the whole system is increased while limiting the overall generated heat.

Optionally, the power transformer includes at least one of the following: a generator, a condenser, and a turbine. The turbine is driven by the pressurized evaporated cooling medium. For example, a turbine wheel is driven to rotate by the gaseous cooling medium. This rotation is transferred to the generator to generate electric power. By lowering the pressure the gaseous cooling medium cools down and the subsequently condensation lowers further the pressure, thereby providing an addition driving force for the turbine.

Optionally, the turbine is adapted to provide a fluid channel for the evaporated cooling medium with a diameter within the range of 5 to 20 mm (or between 6 mm to 12 mm). Therefore, the turbine may be formed as a microturbine or a MEMS turbine (MEMS=micro electro mechanical system) that can be integrated in the electronic circuitry or directly thereon to directly transform the generated heat into electricity. This MEMS turbine may likewise have an integrated generator for electric power.

Optionally, the apparatus further comprises a reservoir for the cooling medium which is formed upstream from the evaporator to store liquid cooling medium. This reservoir may be formed large enough to store a sufficient amount of cooling medium for maintaining the cooling even if the electronic assembly is under a high load.

Optionally, the cooling medium comprises suitable liquid, for example, one or more of the following: ammonia, ethanol, n-butane, b-pentane, HFC-245fa, HFC-245ca, n-perfluoropentane, water or a mixture thereof. However, the cooling medium may be any suitable medium that has the desired evaporation temperature. The invention shall not be limited on particular liquids.

The present invention relates also to an electronic assembly with at least one electronic circuitry, and an apparatus as descripted before, which is configured to provide electric power to the electronic circuitry. Optionally, the electric circuitry includes at least one high power amplifier or comprises any other electronic component with high-power consumption.

The present invention relates further to a method for cooling an electronic assembly comprising: evaporating a cooling medium using heat of the electronic assembly and transforming energy stored in the evaporated cooling medium into electric power. The evaporating temperature is again at atmospheric pressure within a temperature range of 50° C. to 80° C.

According to embodiments of the present invention, not only an effective cooling of the electronic assemblies is achieved, but likewise a usage of the generated heat as additional energy for the electronic assembly.

Embodiments of the present invention are thus based on a phase change cooling system which may operate like a conventional heat pipe. However, in contrast to the conventional heat pipes, embodiments use the energy extracted from the phase change to transform it into another type of energy. For example, the heat stored as latent energy in the evaporated cooling medium can be transformed into electricity using a microturbine. Hence, the heat energy can be recycled in the same system or could be used in other fields.

It is of advantage to use as cooling medium a material that can store through the phase change a significant amount of energy as latent heat. Since the evaporation results in an expansion of the cooling medium, this increases the pressure that can be used to drive the turbine to generate electric power thereof. A particular advantage of embodiments relates to the fact that the cooling system is combined with an electronic system that can reuse the recycled energy which is not wasted as in conventional air-conditioned systems used for high power electronic assemblies.

BRIEF DESCRIPTION OF THE DRAWINGS

Various embodiments of the present invention will be described in the following by way of examples only, and with respect to the accompanying drawings, in which.

DETAILED DESCRIPTION

Various examples will now be described more fully with reference to the accompanying drawings in which some examples are illustrated.

Accordingly, while examples are capable of various modifications and alternative forms, the illustrative examples in the figures and will herein be described in detail. It should be understood, however, that there is no intent to limit examples to the particular forms disclosed, but on the contrary, examples are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing illustrative examples only and is not intended to be limiting. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements and/or components, but do not preclude the presence or addition of one or more other features, steps, operations, elements, components and/or groups thereof.

Unless otherwise defined, all terms (including technical and scientific terms) used herein have the same meaning as commonly understood by one of ordinary skill in the art to which examples belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figure 1:
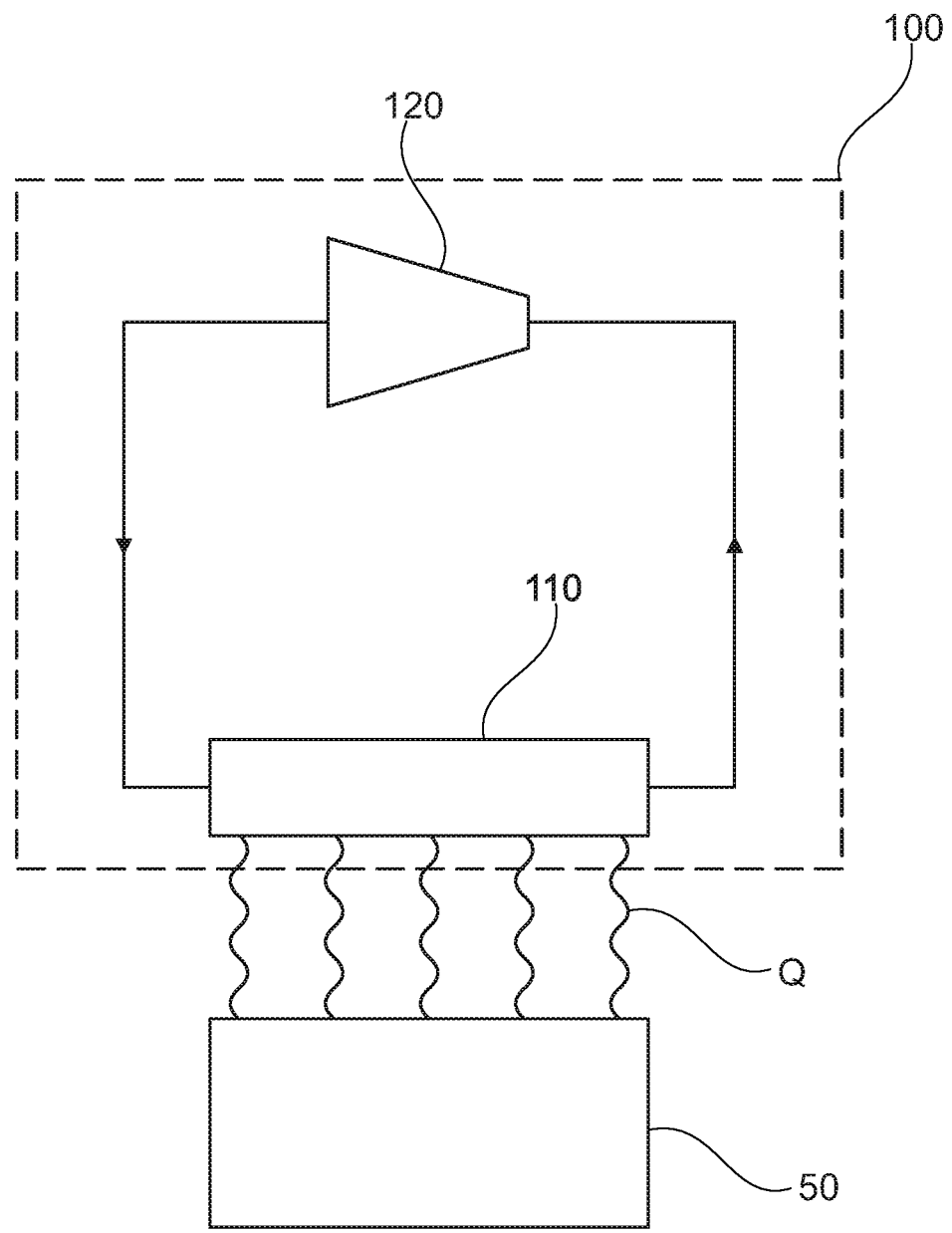
FIG. 1 depicts an apparatus for cooling an electronic assembly according to an embodiment of the present invention.

FIG. 1 depicts an apparatus 100 which is suitable for cooling an electronic assembly 50. The apparatus 100 comprises: an evaporator 110 for evaporating a cooling medium using heat Q of the electronic assembly 50 and a power transformer 120 for transforming energy stored in the evaporated cooling medium into electric power. The cooling medium comprises an evaporating temperature at atmospheric pressure within a temperature range of 50° C. to 80° C. or within 60° C. and 70° C. or about 65° C. The evaporator may provide the evaporated cooling medium under high pressure (higher than atmospheric pressure) to the power transformer 120.

Figure 2:
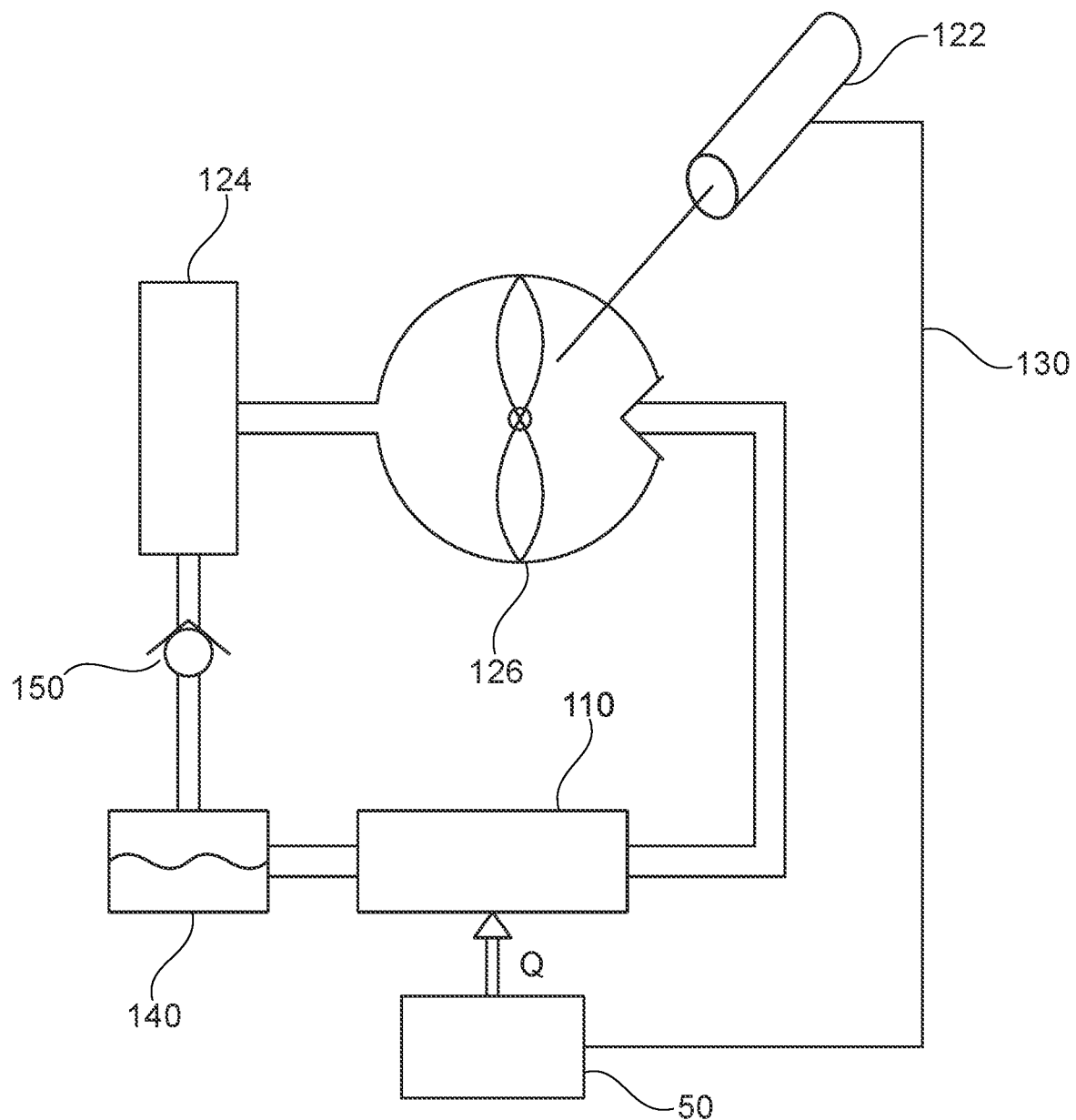
FIG. 2 illustrates further details the power transformer according to embodiments of the present invention.

FIG. 2 depicts further details for the apparatus 100 according to another embodiment of the present invention, wherein the power transformer 120 comprises a generator 122, a turbine 126 and a condenser 124. In addition, a reservoir 140 for the cooling medium is arranged between the condenser 124 and the evaporator 110 to store the liquid cooling medium. The embodiment of FIG. 2 comprises an optional feedback line 130 which provides the electricity generated by the generator 122 to the electronic assembly 50. The electronic assembly 50 is, for example, a high-power amplifier that generates a significant amount of heat used to evaporate the cooling medium in the evaporator 110.

The pressurized evaporated cooling medium is fed from the evaporator 110 to the turbine 126. In the turbine 126 the pressure of the evaporated cooling medium is decreased, thereby driving the turbine 126 and transporting the at least partially de-pressured cooling medium to the condenser 124. In the condenser 124 the evaporated cooling medium is condensed to change its phase back to the liquid phase. A check valve 150 may be provided between the condenser 124 and the reservoir 140 to prevent any back flow of cooling medium into the condenser 124 from the reservoir 140 (e.g. driven by the pressure generated by the evaporator 110).

The rotating turbine 126 drives the generator 122 which generates electricity which then is fed back via the line 130 to the electronic assembly 50.

The turbine 126 comprises, for example, a channel for the cooling medium with a diameter of 5 mm . . . 15 mm or within a range of 3 mm to 20 mm so that it may be a microturbine that can be integrated into the electronic assembly. It is understood that the dimensions of the turbine 126 or the evaporator 110 will be adapted to the particular electronic assembly 50, e.g. to achieve a compact design. The evaporator 110 can, for example, be placed directly on a fan plate of the electronic assembly 50, thereby absorbing the heat energy generated by the electronic assembly 50.

The turbine 126 may be formed as MEMS turbine. Optionally, the overall system with the evaporator 110 and the power transformer 120 may be integrated together into one unit so that the resulting cooling system may be easily placed directly on the electronic assembly. For example, the whole cooling system may be formed as small as a couple of centimeters.

Embodiments may include only the turbine 126 as a MEMS device, but no pumps or compressors. The circulation of the cooling medium may only be gravity driven (in the liquid phase) or thermally driven (in the gaseous phase). Therefore, there is no need for any active device that enables the circulation and which would need further energy. Likewise, embodiments do not need any additional heat source to drive the circulation. The heat of the electronic assembly 50 may suffice to drive the circulation. Therefore, embodiments are of particular advantage for power electronic assemblies 50 that generate sufficient heat.

According to further embodiments, the fluid line from the evaporator 100 is not in thermal contact—or at least not in direct thermal contact—to the fluid line from condenser 124 to the reservoir 140 or to the evaporator 110 (like in vortex devices). This increases the efficiency, because the fluid (cooling medium) is not reheated during the transport from the condenser 124 to the evaporator 110. In addition, the reservoir 140 may be on the same level as the evaporation 110 to provide a continuous cool liquid flow to the evaporator 110, without the need of a pump.

As cooling medium, it is of advantage to use a medium that evaporates at a temperature of about 65° C. or within a range between 50° C. and 80° C. A possible material would be, for example, methanol or any other mixture of an alcohol with a certain amount of water.

The description and drawings merely illustrate the principles of the disclosure. It will thus be appreciated that those skilled in the art will be able to devise various arrangements that, although not explicitly described or shown herein, embody the principles of the disclosure and are included within its scope.

Furthermore, while each embodiment may stand on its own as a separate example, it is to be noted that in other embodiments the defined features can be combined differently, i.e. a particular feature descripted in one embodiment may also be realized in other embodiments. Such combinations are covered by the disclosure herein unless it is stated that a specific combination is not intended.

LIST OF REFERENCE SIGNS 50 electronic assembly/circuitry
110 evaporator
120 power transformer
122 generator
124 condenser
126 turbine
130 feedback line
140 reservoir
150 check valve

What is claimed is:

1. An apparatus configured to cool an electronic assembly, the apparatus comprising:
   an evaporator configured to evaporate a cooling medium using heat of the electronic assembly;
   a power transformer configured to transform energy stored in the evaporated cooling medium into electric power; and
   a reservoir for the cooling medium which is formed upstream from the evaporator, wherein
      the cooling medium has an evaporating temperature at atmospheric pressure within a temperature range of 50° C. to 80° C.,
      the power transformer includes a turbine formed as a micro electro mechanical system (MEMS) and a condenser, and
      a check valve is provided between the condenser and the reservoir to prevent any back flow of cooling medium into the condenser from the reservoir.

2. The apparatus according to claim 1, further comprising a feedback line configured to supply the electric power from the power transformer to the electronic assembly to use the electric energy generated by the power transformer.

3. The apparatus according to claim 1, wherein the power transformer further includes:
   a generator.

4. The apparatus according to claim 3, wherein the turbine is adapted to provide a fluid channel for the evaporated cooling medium with a diameter within the range of 5 to 20 mm.

5. The apparatus according to claim 1, wherein the cooling medium comprises one or more of the following: ammonia, ethanol, n-butane, n-pentane, HFC-245fa, HFC-245ca, n-perfluoropentane, water or a mixture thereof.

6. An electronic assembly including:
   at least one electronic circuitry;
   an evaporator configured to evaporate a cooling medium using heat of the electronic assembly;
   a power transformer configured to transform energy stored in the evaporated cooling medium into electric power; and
   a reservoir for the cooling medium which is formed upstream from the evaporator, wherein
      the cooling medium has an evaporating temperature at atmospheric pressure within a temperature range of 50° C. to 80° C.,
      the power transformer includes a turbine formed as a micro electro mechanical system (MEMS) and a condenser,
      a check valve is provided between the condenser and the reservoir to prevent any back flow of cooling medium into the condenser from the reservoir, and
      the electric power is provided to the electronic circuitry.

7. The electronic assembly according to claim 6, wherein the electric circuitry includes at least one electronic component with high thermal dissipation.

8. The electronic assembly according to claim 7, where the electric circuitry includes a high power amplifier.

9. A method for cooling an electronic assembly comprising:
   providing a power transformer including a turbine formed as a micro electro mechanical system (MEMS) and a condenser;
   providing an evaporator;
   providing a reservoir for a cooling medium which is formed upstream from the evaporator;
   providing a check valve between the condenser and the reservoir to prevent any back flow of the cooling medium into the condenser from the reservoir;
   evaporating, by the evaporator, a cooling medium using heat of an electronic assembly, wherein the cooling medium has an evaporating temperature at atmospheric pressure within a temperature range of 50° C. to 80° C.; and
   transforming, by the power transformer, energy stored in the evaporated cooling medium into electric power.

* * * * *